US009459289B2

(12) United States Patent
Horiuchi et al.

(10) Patent No.: US 9,459,289 B2
(45) Date of Patent: Oct. 4, 2016

(54) PROBE CARD AND METHOD FOR MANUFACTURING PROBE CARD

(71) Applicant: Shinko Electric Industries Co., LTD., Nagano-ken (JP)

(72) Inventors: Michio Horiuchi, Nagano (JP); Ryo Fukasawa, Nagano (JP); Yuichi Matsuda, Nagano (JP); Yasue Tokutake, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 0 days.

(21) Appl. No.: 14/515,564

(22) Filed: Oct. 16, 2014

(65) Prior Publication Data

US 2015/0137849 A1    May 21, 2015

(30) Foreign Application Priority Data

Nov. 19, 2013  (JP) .................. 2013-238776

(51) Int. Cl.
*G01R 3/00*  (2006.01)
*G01R 1/073*  (2006.01)

(52) U.S. Cl.
CPC ............. *G01R 3/00* (2013.01); *G01R 1/07342* (2013.01); *G01R 1/07371* (2013.01); *Y10T 29/49147* (2015.01)

(58) Field of Classification Search
CPC  G01R 3/00; G01R 1/07371; G01R 1/07342; Y10T 29/49147

USPC .................................................. 324/756.03
See application file for complete search history.

(56) References Cited

U.S. PATENT DOCUMENTS

| 7,884,632 | B2 * | 2/2011 | Shiraishi | ............ G01R 1/06727 324/750.25 |
| 2002/0070446 | A1 * | 6/2002 | Horiuchi | ............... H01L 21/568 257/723 |
| 2005/0057235 | A1 * | 3/2005 | Watanabe | ................. G05F 1/56 323/273 |

FOREIGN PATENT DOCUMENTS

JP        2001-249145 A      9/2001

* cited by examiner

*Primary Examiner* — Jermele M Hollington
*Assistant Examiner* — Khristopher Yodichkas
(74) *Attorney, Agent, or Firm* — Wolf, Greenfield & Sacks, P.C.

(57) ABSTRACT

A probe card includes a frame-shaped wiring substrate having interlayer insulation layers and a wiring layer that are alternately stacked. A cavity is defined in a central portion of the wiring substrate. A first insulation layer is arranged in the cavity so that a frame-shaped clearance exists between an outer side surface of the first insulation layer and an inner side surface of the wiring substrate as viewed from above. The cavity is filled with a second insulation layer. A contact terminal projecting from a lower surface of the first insulation layer is electrically connected to the wiring layer by a conductive wire. Elasticity of the second insulation layer is smaller than elasticity of each interlayer insulation layer.

10 Claims, 13 Drawing Sheets

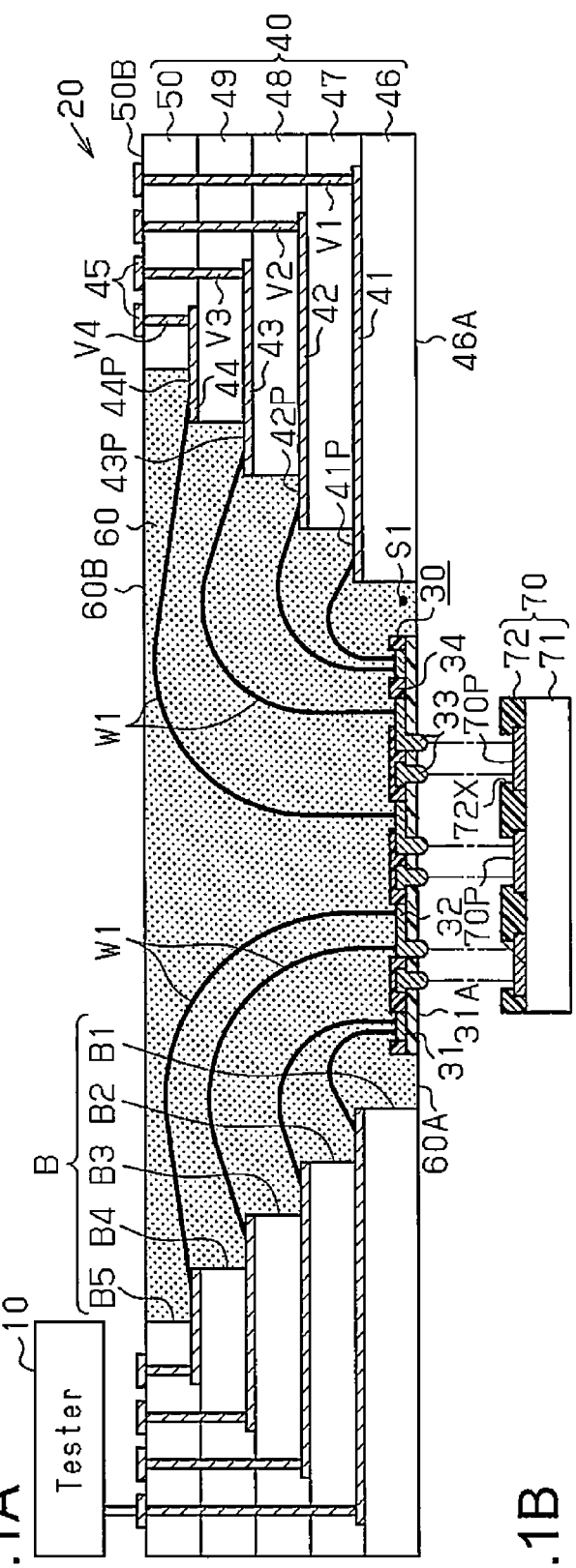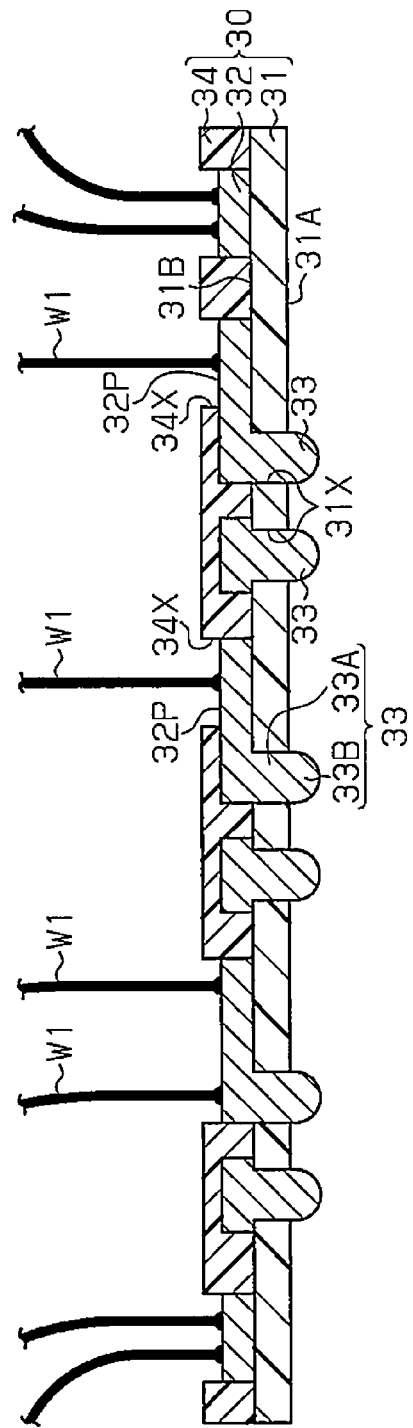

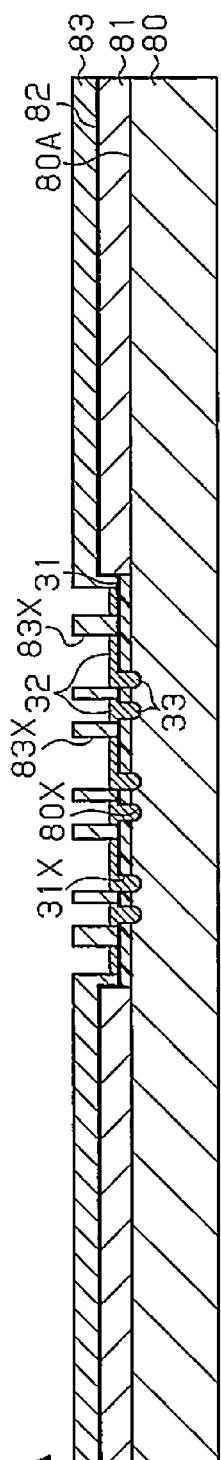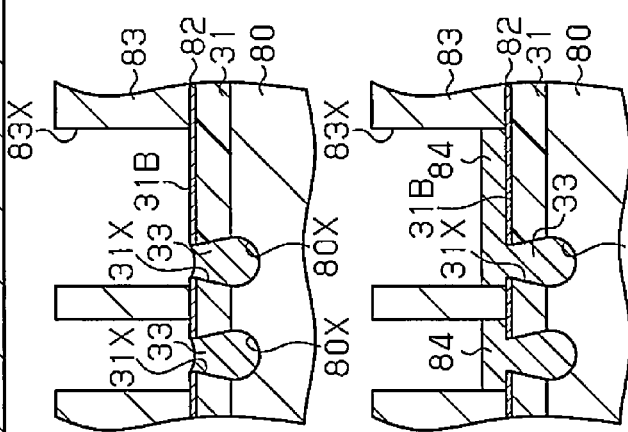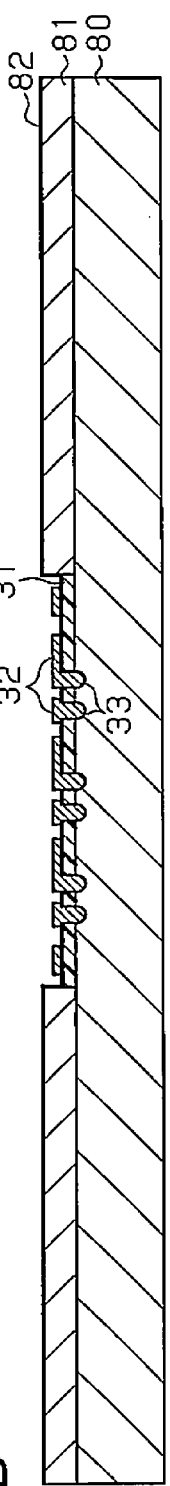
Fig.8A  Fig.8B  Fig.8C  Fig.8D

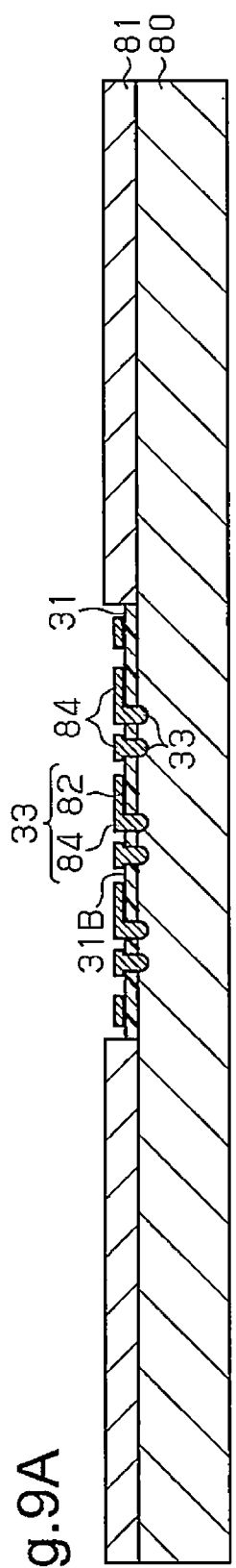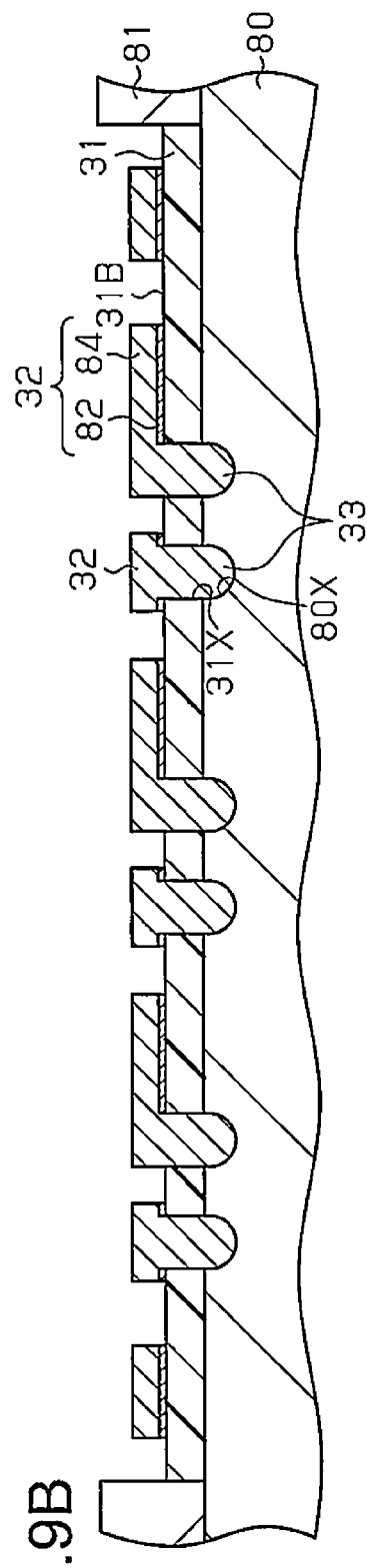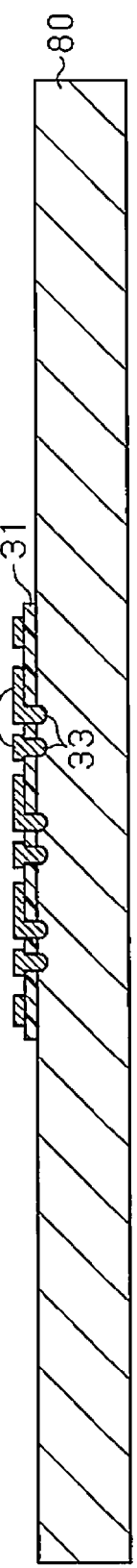

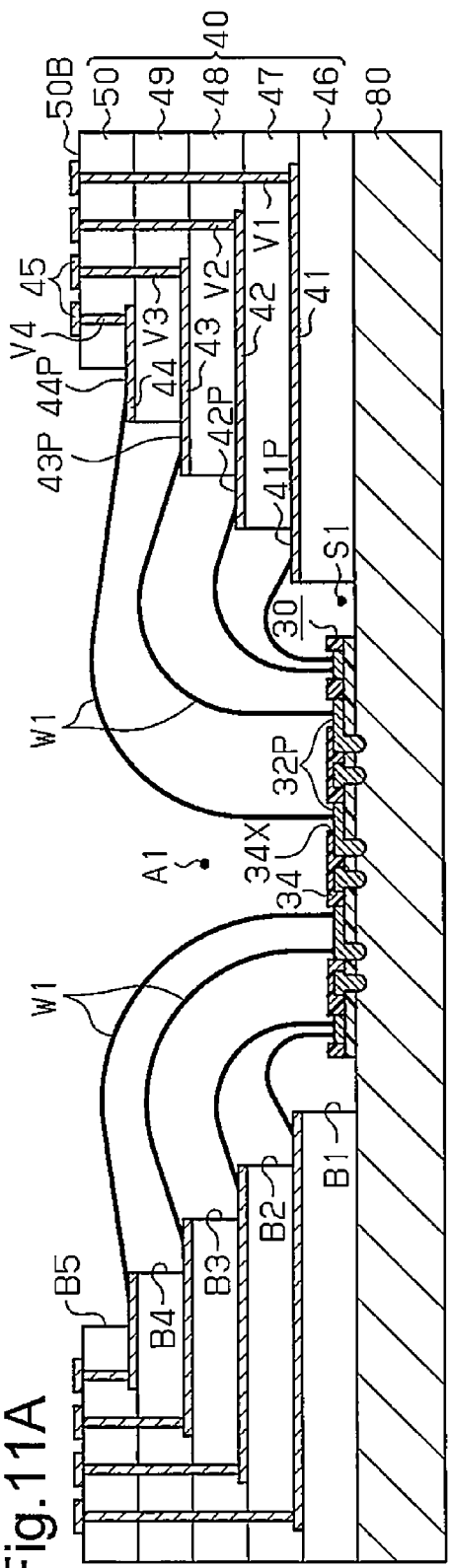
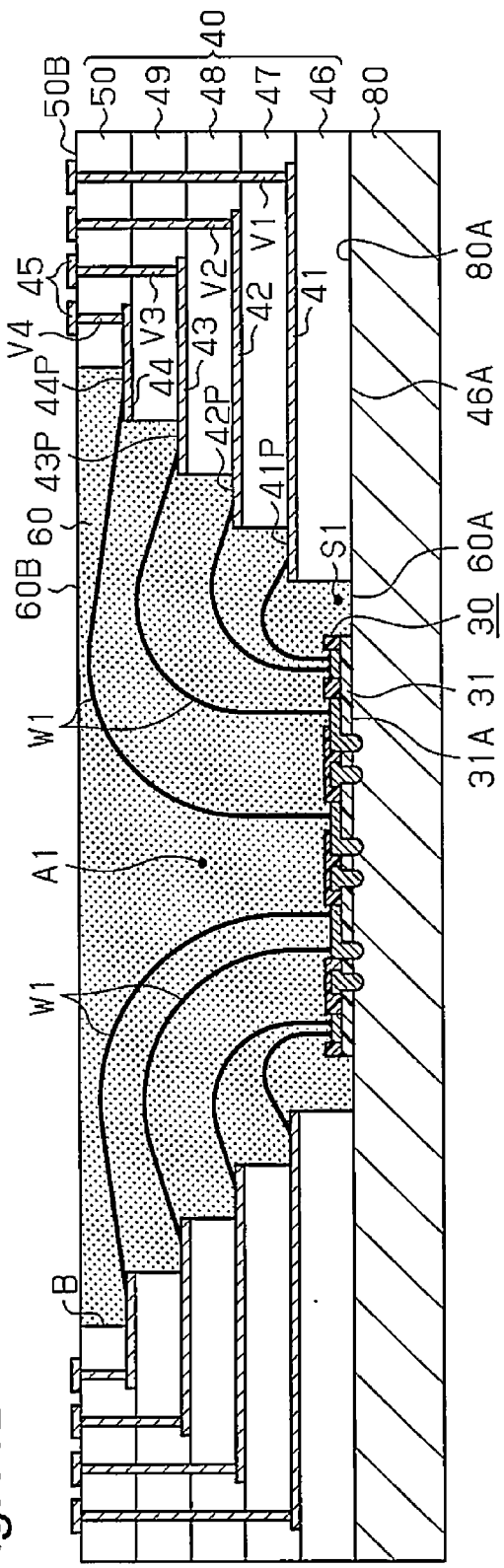
Fig.11A
Fig.11B

PROBE CARD AND METHOD FOR MANUFACTURING PROBE CARD

CROSS-REFERENCE TO RELATED APPLICATIONS

This application is based upon and claims the benefit of priority from prior Japanese Patent Application No. 2013-238776, filed on Nov. 19, 2013, the entire contents of which are incorporated herein by reference.

FIELD

This disclosure relates to a probe card and a method for manufacturing a probe card.

BACKGROUND

A method for manufacturing a semiconductor device includes a step of testing the electrical characteristics of a semiconductor chip. A tester, which is used to perform the testing step, includes a probe stylus (contact terminal), which is electrically connected to an electrode pad formed on a semiconductor chip in a wafer. The tester sends an electric signal to a circuit formed on the semiconductor chip through the probe stylus and receives a signal from the circuit through the probe stylus. The tester checks the operation of the circuit with the received signal to determine whether or not the semiconductor chip is functioning correctly.

The integration of circuit elements and the number of processed signals have increased in semiconductor chips. This has increased the number of electrode pads (pins) on a semiconductor chip and narrowed the pitch of electrode pads. As a result, it has become difficult to have the probe stylus accurately contact each electrode pad.

Japanese Laid-Open Patent Publication No. 2001-249145 describes a probe card that uses a substrate including a plurality of contact terminals to simultaneously contact a plurality of electrode pads. The probe card includes a film-like insulation layer on which the contact terminals are arranged. The insulation layer is joined with the substrate, which is connected to a tester or the like, by a case. In the probe card, the case is filled with a resin layer. Lead wires extend through the resin layer and electrically connect the contact terminals to wires formed on the substrate.

SUMMARY

In the probe card of the above publication, the substrate including the contact terminals is fixed to the case. This causes difficulties when probing a test subject in conformation with the warping and undulation of the test subject. In other words, when the test subject deforms, it is difficult for the contact terminals to accurately contact the electrode pads of the test subject.

One aspect of the present disclosure is a probe card. The probe card includes a first insulation layer. A first contact terminal is arranged on the first insulation layer. The first contact terminal projects from a lower surface of the first insulation layer. A wiring pattern is arranged on an upper surface of the first insulation layer. The wiring pattern includes a rewire, which is connected to the first contact terminal, and a first pad, which is connected to the rewire. A wiring substrate includes an interlayer insulation layer, a wiring layer arranged on the interlayer insulation layer, and a cavity defined in a central portion of the interlayer insulation layer and in a central portion of the wiring layer. The wiring substrate is spaced apart from the first insulation layer arranged in the cavity. A second insulation layer supports the first insulation layer and the wiring substrate. The cavity is filled with the second insulation layer. A conductive wire is arranged in the second insulation layer. The conductive wire electrically connects the first contact terminal and the wiring layer. The first pad is bonded with the conductive wire, and the second insulation layer has a lower elasticity than the interlayer insulation layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic cross-sectional view illustrating a semiconductor testing device including a probe card of one embodiment;

FIG. 1B is an enlarged cross-sectional view illustrating a portion of the probe card of FIG. 1A;

FIGS. 6A to 6D, 7A to 7D, 8A to 8D, 9A to 9C, 10A to 10C, 11A, 11B, and 12 are schematic cross-sectional views illustrating a method for manufacturing the probe card of FIG. 1A, where FIG. 6C is an enlarged cross-sectional view of the structure illustrated in FIG. 6B, FIG. 7C is an enlarged cross-sectional view of the structure illustrated in FIG. 7B, FIGS. 8B and 8C are enlarged cross-sectional views of the structure illustrated in FIG. 8A, FIG. 9B is an enlarged cross-sectional view of the structure illustrated in FIG. 9A, and FIG. 10B is an enlarged cross-sectional view of the structure illustrated in FIG. 10A;

DESCRIPTION OF THE EMBODIMENTS

Figure 2:
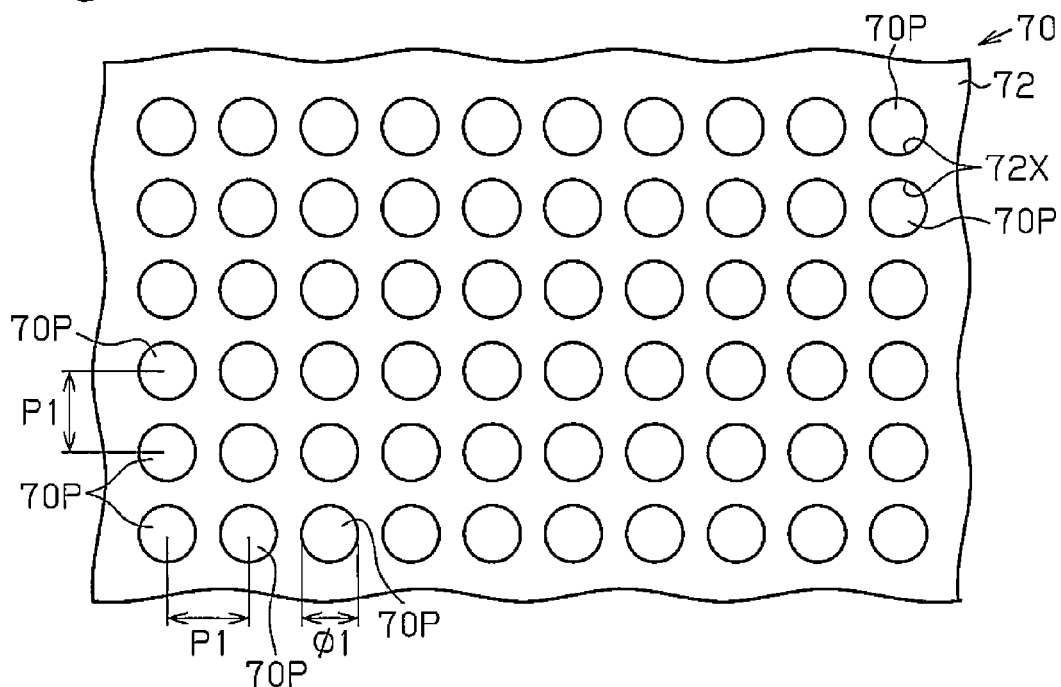
FIG. 2 is a schematic plan view illustrating electrode pads of a test subject.

Various embodiments will now be described with reference to the accompanying drawings. In the drawings, elements have not necessarily been drawn to scale. In the cross-sectional drawings, components may be illustrated without hatching lines or be illustrated by shadings instead of hatching lines.

[Structure of Semiconductor Testing Device]

As illustrated in FIG. 1A, a semiconductor testing device that tests a test subject 70 includes a tester 10 and a probe card 20 connected to the tester 10.

The test subject 70 is, for example, a single semiconductor wafer. Semiconductor chips, which will be cut apart in a subsequent process, are formed in the semiconductor wafer. Further, the test subject 70 includes electrode pads 70P, which are connected to circuit elements (not illustrated) formed on a silicon substrate 71. The test subject 70 includes, for example, a passivation film 72. The electrode pads 70P are exposed from openings 72X formed in the passivation film 72.

As illustrated in FIG. 2, the electrode pads 70P are laid out in a matrix-like array. Each electrode pad 70P has a diameter Φ1 of, for example, approximately 20 μm. The electrodes 70P are laid out at a pitch P1 of, for example, approximately 40 μm.

The semiconductor testing device illustrated in FIG. 1A tests the test subject 70 through electrical contact between the probe card 20 and the test subject 70. The probe card 20 includes a terminal layout surface (lower surface in this case) that faces the test subject 70. Contact terminals 33 are formed on the terminal layout surface. The probe card 20 of the present example is configured to test the test subject 70 by performing four-terminal resistance measurement, which has high accuracy. Thus, the probe card 20 includes pairs of contact terminals 33 so that two of contact terminals 33 are connected to one of electrode pads 70P of the test subject 70.

[Structure of Probe Card]

The structure of the probe card 20 will now be described.

As illustrated in FIG. 1A, the probe card 20 includes a substrate 30, a wiring substrate 40 spaced apart from the substrate 30, conductive wires W1 electrically connecting the substrate 30 and the wiring substrate 40, and an insulation layer 60. The insulation layer 60 partially covers the substrate 30 and the wiring substrate 40. Further, the insulation layer 60 supports the substrate 30 and the wiring substrate 40.

The substrate 30 includes an insulation layer 31, wiring patterns 32, the contact terminals 33, and an insulation layer 34. For example, the side surfaces and upper surface of the substrate 30 are covered by the insulation layer 60, and the lower surface of the substrate 30 is exposed from the insulation layer 60.

The insulation layer 31 is, for example, a thin film and may have a thickness of, for example, approximately 3 to 10 μm. The insulation layer 31 may have any shape as viewed from above. For example, the insulation layer 31 may be tetragonal as viewed from above. The material of the insulation layer 31 may be, for example, an insulative resin of which the main component is an epoxy resin, a phenol resin, a polyimide resin, or a novolac resin. The insulation layer 31 may include a filler such as silica ($SiO_2$) or alumina ($Al_2O_3$). Preferably, the material of the insulation layer 31 has a relatively low elasticity. For example, the material of the insulation layer 31 is preferably a low-elasticity material having a lower elasticity than the organic resin forming interlayer insulation layers 46 to 50 of the wiring substrate 40.

The lower surface 31A of the insulation layer 31 is exposed from the insulation layer 60. The lower surface 31A of the insulation layer 31 is, for example, substantially flush with the lower surface of the wiring substrate 40 (in the present embodiment, the lower surface 46A of the interlayer insulation layer 46).

As illustrated in FIG. 1B, the insulation layer 31 includes through holes 31X extending through the insulation layer 31 in the thicknesswise direction at certain locations. The through holes 31X are formed at locations corresponding to the electrode pads 70P formed on the test subject 70. Each through hole 31X has a diameter of, for example, approximately 5 to 7 μm.

The wiring patterns 32 are formed on the upper surface 31B of the insulation layer 31. Each wiring pattern 32 may have a thickness of, for example, approximately 5 to 20 μm. The contact terminals 33 are formed in portions of the lower surfaces of the wiring patterns 32. The contact terminals 33 are exposed from the through holes 31X. The wiring patterns 32 and the contact terminals 33 are, for example, formed integrally. That is, the wiring patterns 32 and the contact terminals 33 are supported by the insulation layer 31.

Each contact terminal 33 is, for example, a rod-shaped terminal extending downward through the corresponding through hole 31X from the lower surface of the wiring pattern 32. Accordingly, the through hole 31X is filled with the contact terminal 33. Further, each contact terminal 33 projects downward from the lower surface 31A of the insulation layer 31. In the present example, each contact terminal 33 includes a via 33A, which is located in the through hole 31X, and a projection 33B, which projects downward from the lower surface 31A of the insulation layer 31. The via 33A and the projection 33B are formed integrally with each other. Each contact terminal 33 is, for example, cylindrical. The via 33A has, for example, a tetragonal cross-section, and the projection 33B has, for example, a semispherical form (refer to FIG. 1B) or the form of an inversed and truncated cone.

Figure 3:
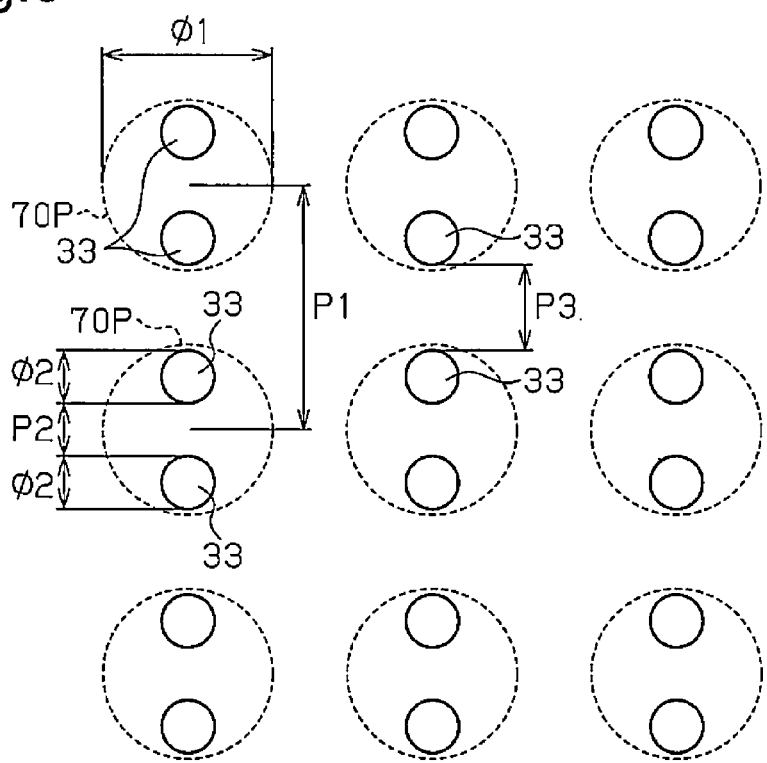
FIG. 3 is a schematic plan view illustrating the positional relationship of contact terminals of the probe card and electrode pads of a test subject.

As illustrated in FIG. 3, the contact terminals 33 are formed at locations corresponding to the electrode pads 70P of the test subject 70. When conducting a test, the contact terminals 33 contact the electrode pads 70P for electrical connection. In the present example, each pair of the contact terminals 33 is connected to one of the electrode pads 70P. In other words, the diameter of φ2 of each contact terminal 33 and the interval P2 between the two contact terminals 33 in each pair are set so that two contact terminals 33 are connected to one electrode pad 70P. The diameter φ2 of each contact terminal 33 may be, for example, approximately 5 to 7 μm. Further, the interval P2 between two contact terminals 33 is set to be shorter than the interval P3 between two contact terminals 33 connected to different electrode pads 70P (the adjacent contact terminals 33 of two different pairs). For example, the interval P2 may be approximately 5 to 6 μm, and the interval P3 may be 8 to 10 μm. Further, each contact terminal 33 may have a height of, for example, 8 to 20 μm. In FIG. 1B, for example, each via 33A has a height of approximately 3 to 10 μm, and each projection 33B has a height of approximately 5 to 10 μm.

The wiring patterns 32 and the contact terminals 33 may be, for example, gold (Au) layers. An Au layer is a metal layer formed from Au or an Au alloy. The Au layer may be, for example, a metal layer formed by performing electrolytic plating (electrolytic plating metal layer). A seed layer (e.g., lamination of a titanium (Ti) layer and a Cu layer) may be formed on the wiring patterns 32 and the contact terminals 33 that are formed by Au layers.

Figure 4:
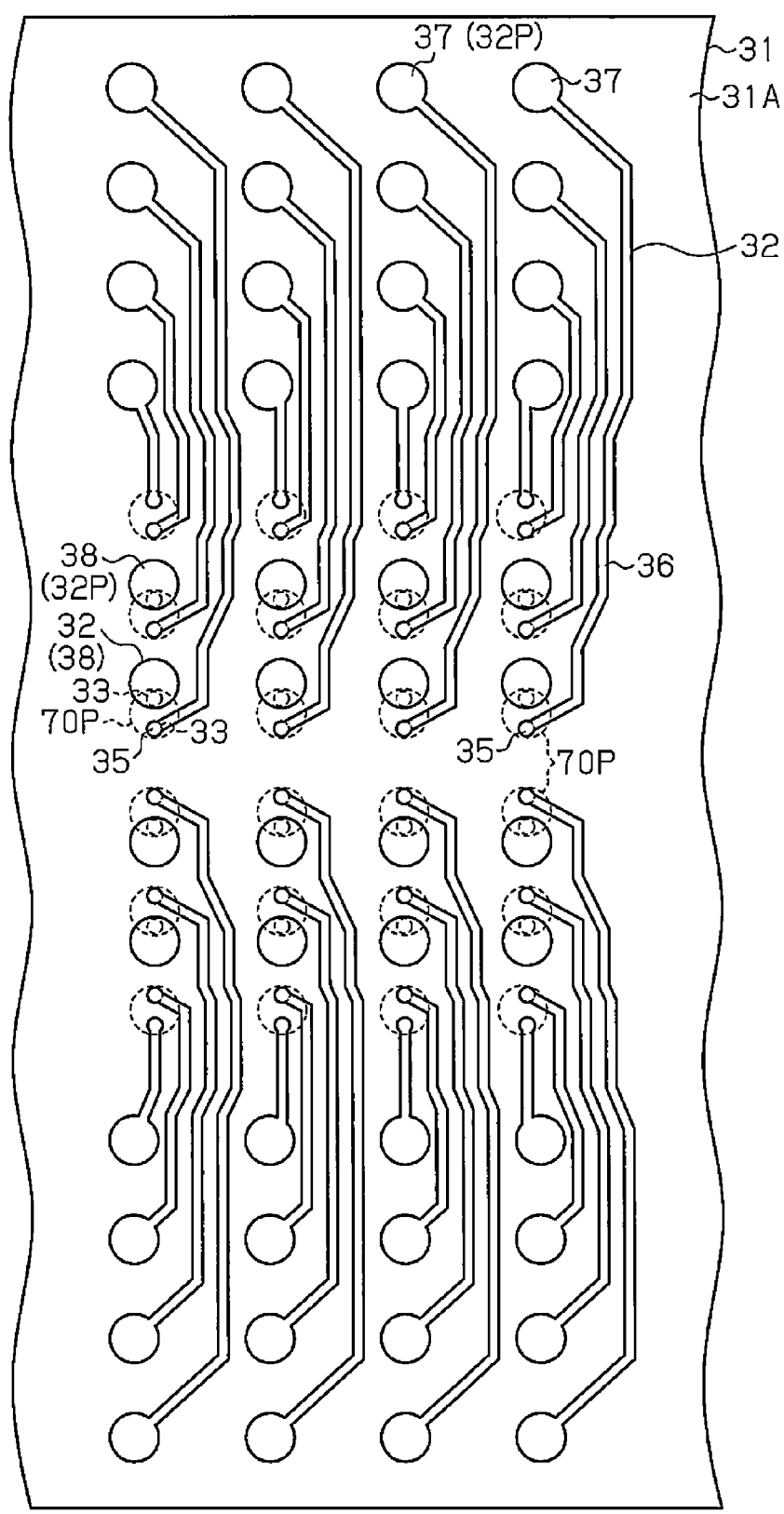
FIG. 4 is a schematic plan view illustrating wiring patterns of the probe card.

As illustrated in FIG. 4, the wiring patterns 32 have various shapes. For example, the wiring patterns 32 include a first wiring pattern that includes a connection portion 35, a rewire 36, and a pad 37. The connection portion 35 is connected to one of the contact terminals 33. The contact terminal 33 that is connected to the connection portion 35 of the first wiring pattern is referred to as the first contact terminal. The rewire 36 extends from the connection portion 35 in a planar direction (direction orthogonal to the thicknesswise direction of the substrate 30). The distal end of the rewire 36 is connected to the pad 37. The pad 37 of the first wiring pattern including the rewire 36 is referred to as the first pad. In this manner, the rewire 36 has one end connected to the contact terminal 33 (first contact terminal) and another end connected to the pad 37 (first pad). The connection portion 35, the rewire 36, and the pad 37 are formed integrally. The wiring patterns 32 also include a second wiring pattern that includes only the pad 38 connected to one of the contact terminals 33. The pad 38 of the second wiring pattern is referred to as the second pad, and the contact terminal 33 connected to the pad 38 (second pad) is referred to as the second contact terminal. In other words, the pad 38 is formed immediately above the contact terminal 33 (second contact terminal). In the description hereafter and the drawings, the pads 37 and 38 may collectively be referred to as the pads 32P.

Each connection portion 35 is formed immediately above a contact terminal 33. The connection portion 35, as viewed from above, may have any shape or size. For example, the connection portion 35 may be circular as viewed from above and have about the same diameter as the contact terminal 33. The diameter of the connection portion 35 may be, for example, approximately 5 to 8 μm.

As described above, each connection portion 35 is formed on one end of the corresponding rewire 36. The other end of the rewire 36 is connected to the corresponding pad 37. The rewire 36 adjusts the pitch between adjacent pads 32P (pitch between pads 37 and pitch between pads 37 and 38) to a certain distance to obtain a distance allowing for wire bonding (e.g., 40 μm or longer). For example, the rewire 36 extends in the planar direction from the connection portion 35, which is connected to the contact terminal 33 (first contact terminal), to the pad 37, which is arranged in a region located at the outer side of the contact terminal 33 (first contact terminal), passing by other pads 37 and 38. The wire width/wire interval (line L/space S) of the rewire 36 may be, for example, 5 μm/5 μm.

Each pad 37 is a wire bonding pad that is bonded with a conductive wire W1 (refer to FIGS. 1A and 1B). The pad 37 is, for example, larger than the connection portion 35 and the contact terminal 33 as viewed from above. Such a pad 37 may have any shape or size as viewed from above. For example, the pad 37 may be circular as viewed from above and have a diameter of approximately 20 to 30 μm. The pitch of the pads 37 may be, for example, approximately 40 to 50 μm.

Each pad 38 is also a wire bonding pad and bonded with a conductive wire W1 (refer to FIGS. 1A and 1B). The pad 38 covers the upper surface of the corresponding contact terminal 33 (via 33A) and the upper surface 31B of the insulation layer 31 around the contact terminal 33. The pad 38 partially overlaps the contact terminal 33 as viewed from above and is larger than the contact terminal 33 as viewed from above. The pad 38 may have any shape and size as viewed from above. For example, the pad 38 may be circular as viewed from above and have a diameter of approximately 20 to 30 μm. The pitch of the pads 38 may be, for example, 40 μm or longer. For example, the pitch of the pads 32P (pads 37 and 38) in the sideward direction as viewed in FIG. 4 may be approximately 40 μm, and the pitch of the pads 32P in the vertical direction as viewed in FIG. 4 may be approximately 50 μm.

As illustrated in FIG. 1B, the insulation layer 34 partially covers the upper surfaces of the wiring patterns 32 and entirely covers the upper surface 31B of the insulation layer 31 exposed from between the wiring patterns 32. The insulation layer 34 includes openings 34X exposing portions of the wiring patterns 32 as the pads 32P. The material of the insulation layer 34 may be, for example, an insulative resin of which the main component is an epoxy resin, a phenol resin, a polyimide resin, or a novolac resin. The insulation layer 34 may include a filler such as silica ($SiO_2$) or alumina ($Al_2O_3$).

As illustrated in FIG. 1A, the substrate 30 is spaced apart from the frame-shaped wiring substrate 40, which forms the peripheral region of the probe card 20. That is, the substrate 30 is not directly joined with the wiring substrate 40, and a clearance S1 exists between the substrate 30 and the wiring substrate 40. The clearance S1 is frame-shaped and extends between the outer surface of the substrate 30 and the inner surface of the wiring substrate 40 as viewed from above.

The wiring substrate 40 is a multilayer wiring substrate in which wiring layers and interlayer insulation layers are alternately stacked. In the wiring substrate 40 of the present example, five wiring layers 41, 42, 43, 44, and 45 and five interlayer insulation layers 46, 47, 48, 49, and 50 are alternately stacked.

The material of each of the wiring layers 41 to 45 may be, for example, copper (Cu) or a copper alloy. The material of each of the interlayer insulation layers 46 to 50 may be, for example, an organic resin such an epoxy resin or a polyimide resin. Further, the material of each of the interlayer insulation layers 46 to 50 may be, for example, a reinforced insulative resin containing a reinforcement material impregnated with an epoxy or polyimide thermosetting resin. The reinforcement material may be a woven fabric or a nonwoven fabric of glass, aramid, or liquid crystal polymer (LCP) fibers.

Figure 5:
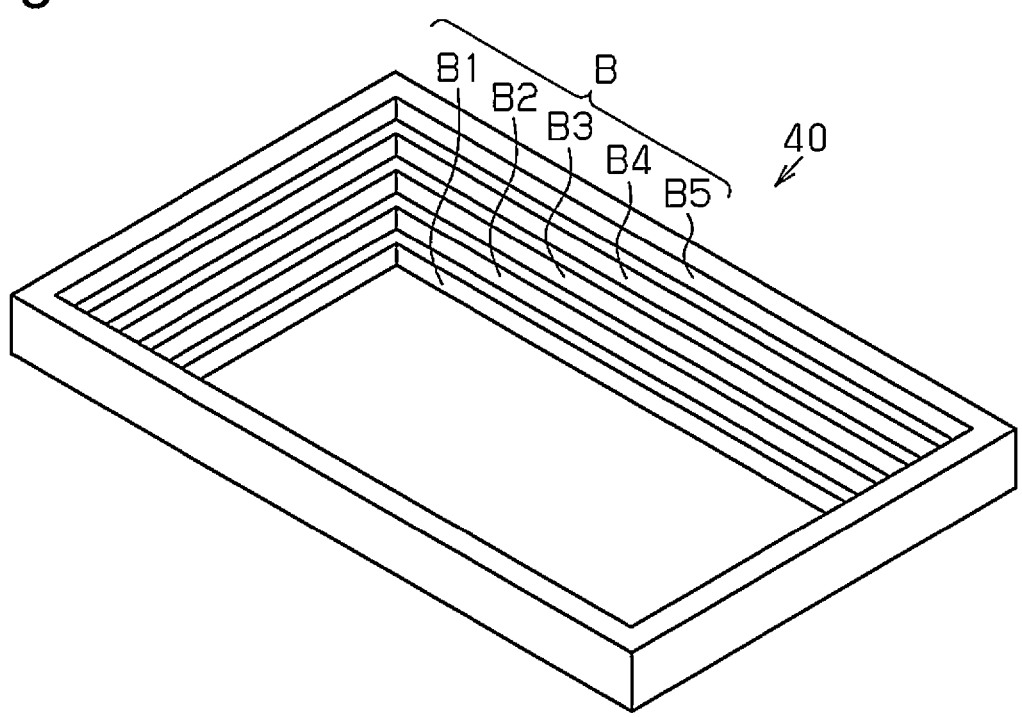
FIG. 5 is a schematic perspective view illustrating a wiring substrate of the probe card.

As illustrated in FIG. 5, the central portion of the frame-shaped wiring substrate 40 defines a cavity B. In the present example, the wiring substrate 40 has an inner surface including steps, and the void surrounded by the inner surface of the wiring substrate 40 defines the cavity B.

As illustrated in FIG. 1A, the interlayer insulation layer 46 is formed as the lowermost layer of the wiring substrate 40 and includes an opening B1. The lower surface 46A of the interlayer insulation layer 46 is exposed from the lower surface 60A of the insulation layer 60. The lower surface 46A of the interlayer insulation layer 46 is, for example, substantially flush with the lower surface 60A of the insulation layer 60. Further, the lower surface 46A of the interlayer insulation layer 46 is substantially flush with the lower surface 31A of the insulation layer 31.

The wiring layer 41 is stacked on the upper surface of the interlayer insulation layer 46. The wiring layer 41 includes connection pads 41P located in the proximity of the opening B1. The wiring layer 41 is electrically connected to wires of the wiring layer 45, which is stacked as the uppermost layer on the upper surface 50B of the interlayer insulation layer 50, by vias V1 extending through the interlayer insulation layers 47, 48, 49, and 50 in the thicknesswise direction (stacking direction). The material of the vias V1 may be, for example, copper or a copper alloy.

The interlayer insulation layer 47, which partially covers the wiring layer 41, is stacked on the upper surface of the interlayer insulation layer 46. The interlayer insulation layer 47 includes an opening B2 that is slightly larger than the opening B1. Due to the opening B2, the interlayer insulation layer 46 projects toward the inner side from the interlayer insulation layer 47 in the form of a frame. The connection pads 41P are located on the upper surface of the frame-shaped projection of the interlayer insulation layer 46.

The wiring layer 42 is stacked on the upper surface of the interlayer insulation layer 47. The wiring layer 42 includes connection pads 42P located in the proximity of the opening B2. The wiring layer 42 is electrically connected to wires of the wiring layer 45 by vias V2 extending through the interlayer insulation layers 48, 49, and 50 in the thicknesswise direction. The material of the vias V2 may be, for example, copper or a copper alloy.

The interlayer insulation layer 48, which partially covers the wiring layer 42, is stacked on the upper surface of the interlayer insulation layer 47. The interlayer insulation layer 48 includes an opening B3 that is slightly larger than the opening B2. Due to the opening B3, the interlayer insulation layer 47 projects toward the inner side from the interlayer insulation layer 48 in the form of a frame. The connection pads 42P are located on the upper surface of the frame-shaped projection of the interlayer insulation layer 47.

The wiring layer 43 is stacked on the upper surface of the interlayer insulation layer 48. The wiring layer 43 includes connection pads 43P located in the proximity of the opening B3. The wiring layer 43 is electrically connected to wires of the wiring layer 45 by vias V3 extending through the interlayer insulation layers 49 and 50 in the thicknesswise direction. The material of the vias V3 may be, for example, copper or a copper alloy.

The interlayer insulation layer 49, which partially covers the wiring layer 43, is stacked on the upper surface of the interlayer insulation layer 48. The interlayer insulation layer 49 includes an opening B4 that is slightly larger than the opening B3. Due to the opening B4, the interlayer insulation layer 48 projects toward the inner side from the interlayer insulation layer 49 in the form of a frame. The connection pads 43P are located on the upper surface of the frame-shaped projection of the interlayer insulation layer 48.

The wiring layer 44 is stacked on the upper surface of the interlayer insulation layer 49. The wiring layer 44 includes connection pads 44P located in the proximity of the opening B4. The wiring layer 44 is electrically connected to wires of the wiring layer 45 by vias V4 extending through the interlayer insulation layers 50 in the thicknesswise direction. The material of the vias V4 may be, for example, copper or a copper alloy.

The interlayer insulation layer 50, which partially covers the wiring layer 44, is stacked on the upper surface of the interlayer insulation layer 49. The interlayer insulation layer 50 includes an opening B5 that is slightly larger than the opening B4. Due to the opening B5, the interlayer insulation layer 49 projects toward the inner side from the interlayer insulation layer 50 in the form of a frame. The connection pads 44P are located on the upper surface of the frame-shaped projection of the interlayer insulation layer 49.

The wiring layer 45 is formed on the upper surface 50B of the interlayer insulation layer 50. The wiring layer 45 is, for example, electrically connected to the tester 10. The upper surface of the interlayer insulation layer 50 and the upper and side surfaces of the wiring layer 45 are exposed from the insulation layer 60. For example, the upper surface 50B of the interlayer insulation layer 50 is substantially flush with the upper surface 60B of the insulation layer 60.

In this manner, the cavity B of the wiring substrate 40 is defined at the inner side of the interlayer insulation layers 46 to 50 and the wiring layers 41 to 44 that are stacked in a step-like manner to form steps. The cavity B is surrounded by steps formed by the inner side surfaces of the interlayer insulation layer 46, the exposed upper surface of the wiring layer 41, the inner side surfaces of the interlayer insulation layer 47, the exposed upper surface of the wiring layer 42, the inner side surfaces of the interlayer insulation layer 48, the exposed upper surface of the wiring layer 43, the inner side surfaces of the interlayer insulation layer 49, the exposed upper surface of the wiring layer 44, and the inner side surfaces of the interlayer insulation layer 50. The substrate 30 is located in such a cavity B.

The conductive wires W1 are located in the cavity B of the wiring substrate 40. The conductive wire W1 connects the pads 32P, which are formed on the substrate 30, and the connection pads 41P, 42P, 43P, and 44P, which are formed in the wiring substrate 40. That is, the conductive wires W1 three-dimensionally connect the pads 32P to the connection pads 41P, 42P, 43P, and 44P. The conductive wires W1 electrically connect the wiring patterns 32 to the wiring layers 41 to 44. As a result, each patterned wire in the wiring layer 45 is electrically connected to a contact terminal 33 via one of the wiring layers 41 to 44, a conductive wire W1, and the wiring pattern 32. The conductive wires W1 may be formed from a material that is three-dimensionally flexible. For example, Cu wires, Au wires, or aluminum (Al) wires may be formed as the conductive wire W1.

The cavity B (openings B1 to B5), which includes the clearance S1 between the substrate 30 and the wiring substrate 40, is filled with the insulation layer 60. The insulation layer 60 covers the inner side surfaces of the wiring substrate 40 (interface with cavity B), the upper surface and the side surfaces of the substrate 30 (outer side surfaces of the insulation layer 31, upper surface and outer side surfaces of the insulation layer 34, and upper surfaces of the pads 32P) and the conductive wires W1. The insulation layer 60 supports and bonds the substrate 30 and the wiring substrate 40 which are spaced apart from each other.

The insulation layer 60 has elastomeric properties. For example, the insulation layer 60 has a lower elasticity than the insulation layers 46 to 50 of the wiring substrate 40. That is, the insulation layer is formed from a low-elasticity material having a lower elasticity than the organic resin forming the interlayer insulation layers 46 to 50. Preferably, such a low-elasticity material has a Young's modulus that is 1 MPa or greater and 10 MPa or less under room temperature (20° C. to 30° C.). The low-elasticity material may be, for example, a silicone, fluorine, polyolefin, or urethane elastomer.

[Operation of Probe Card]

The probe card 20 is held parallel to the test subject 70, which is fixed to a test base (not illustrated). The probe card 20 and the test subject 70 are positioned relative to each other so that the contact terminals 33 face the electrode pads 70P. Then, the distal ends of the contact terminals 33 contact the electrode pads 70P as illustrated by the single-dashed lines in FIG. 1A. In the probe card 20 of the present example, two contact terminals 33 contact one electrode pad 70P. The insulation layer 31, which supports the contact terminals 33, is not directly joined with the wiring substrate 40. The insulation layer 60, which has elastomeric properties, bonds the insulation layer 31 to the wiring substrate 40. Thus, the wiring substrate 40 restricts deformation of the insulation layer 31 (substrate 30). As a result, when the test subject 70 warps or undulates, the insulation layer 60 deforms in conformance with the warping or undulation of the test subject 70. This allows the contact terminals 33 to accurately contact the electrode pads 70P of the test subject 70.

[Method for Manufacturing Probe Card]

A method for manufacturing the probe card 20 will now be described.

Figure 6A:
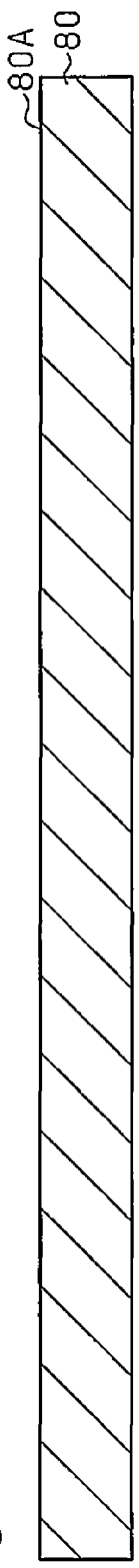

In the step illustrated in FIG. 6A, a support substrate 80 is first prepared. The support substrate 80 is, for example, a flat plate that is tetragonal as viewed from above. For example, a metal plate or a metal foil may be used as the support substrate 80. In the present embodiment, for example, a copper plate is used as the support substrate 80. The support substrate 80 has a thickness of, for example, approximately 70 to 200 μm. The upper surface 80A of the support substrate 80 is flattened.

Figure 6B:
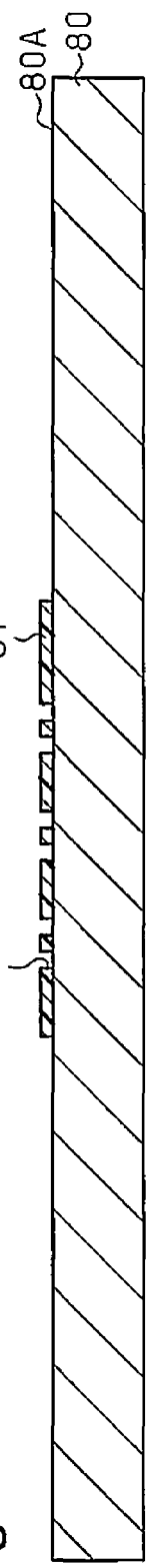

In the step illustrated in FIG. 6B, the insulation layer 31, which includes the through holes 31X, is formed on the upper surface 80A of the support substrate 80. The insulation layer 31 functions as an etching mask in an etching process illustrated in FIG. 7A and functions as a resist in a plating process illustrated in FIGS. 8A to 8C. To keep the insulation layer 31 unremoved after the plating process, the employment of a permanent resist as the insulation layer 31, which is used to insulate the contact terminals 33 (refer to FIGS. 1A and 1B), is preferable. The material of the insulation layer 31 is not particularly limited as long as the material is etching resistant and plating resistant and has the desired resolution properties. For example, the material of the insulation layer 31 may be a photosensitive dry film resist or a liquid photoresist. The material of such a resist may be, for example, an epoxy resin, a phenol resin, a polyimide resin, a novolac resin, or the like.

For example, when using a photosensitive dry film resist, thermal compression bonding is performed to laminate the upper surface 80A of the support substrate 80 with a dry film. The dry film then undergoes exposure and development. This patterns the dry film and forms the insulation layer 31. The lamination with the dry film is performed under a vacuum atmosphere to suppress the entrapment of voids. Further, when using a liquid photoresist, for example, spin coating is performed to apply the liquid photoresist to the upper surface 80A of the support substrate 80. The photoresist then undergoes exposure and development. This patterns the dry film and forms the insulation layer 31.

Figure 6C:
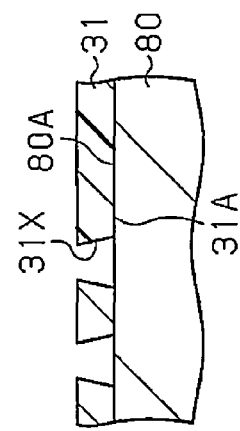

As illustrated in FIG. 6C, each through hole 31X may be inversely tapered so that the diameter decreases from the lower side, which faces the upper surface 80A of the support substrate 80, toward the upper side. For example, when forming the through holes 31X, the exposure light reflected by the support substrate 80 (copper plate) may be used to remove the lower surface 31A (surface contacting the support substrate 80) to obtain the inversed taper of the through holes 31X.

Figure 6D:
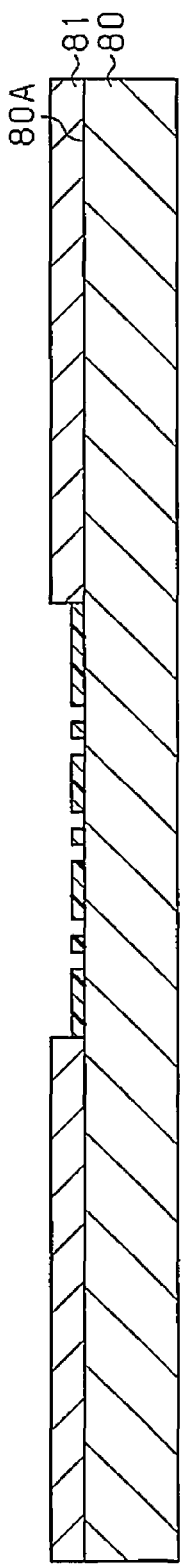

In the step illustrated in FIG. 6D, a mask 81 is formed over the peripheral region of the support substrate 80 surrounding the insulation layer 31 to entirely cover the upper surface 80A of the support substrate 80 in the peripheral region. An etching resistant material that withstands the etching performed in the following step may be used as the material of the mask 81. For example, masking tape of a resist layer may be used as the mask 81. For example, vinyl chloride or a PET film may be used as the material of the masking tape. The mask 81 may be formed by, for example, applying masking tape, which includes a central opening, to the upper surface 80A of the support substrate 80 to form the mask 81. For example, the mask 81 is temporarily adhered to the upper surface 80A of the support substrate 80 to allow for easy stripping from the support substrate 80 in a subsequent step.

Figure 7A:
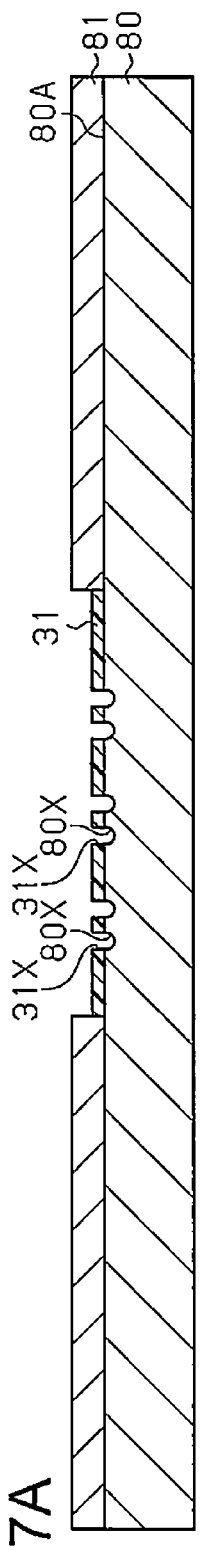

In the step illustrated in FIG. 7A, using the insulation layer 31 and the mask 81 as etching masks, the support substrate 80 is etched (half-etched) from the upper surface 80A to form recesses 80X. The recesses 80X are formed in the upper surface 80A of the support substrate 80 exposed from the through holes 31X of the insulation layer 31. The etching may be, for example, wet etching (isotropic etching). When performing wet etching to reduce the thickness of the support substrate 80, the etching liquid may be selected in accordance with the material of the support substrate 80. For example, when using copper as the material of the support substrate 80, a ferric chloride solution, a copper chloride solution, or an ammonium persulfate solution may be used as the etching solution. For example, spray etching may be performed from the upper surface 80A of the support substrate 80 to reduce the thickness of the support substrate (form the recesses 80X). In this manner, by performing wet etching to pattern the support substrate 80, a side etching effect occurs in which the etching advances in the planar direction of the support substrate 80. This forms each recess 80X with a semicircular cross-section (refer to FIG. 7A) or a trapezoidal cross-section.

Figure 7B:
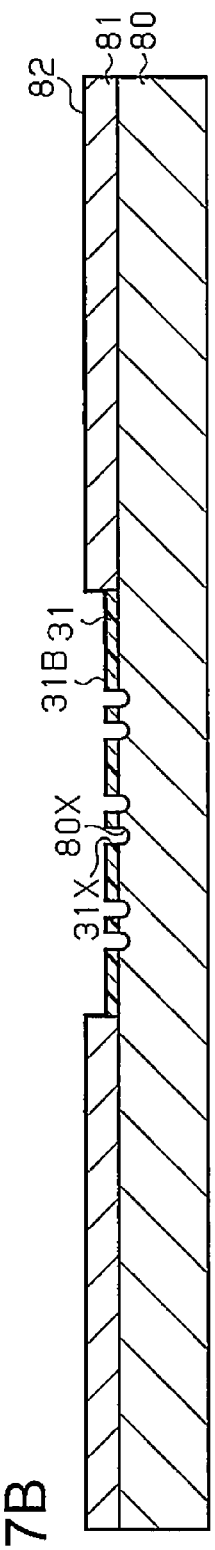
Figure 7C:
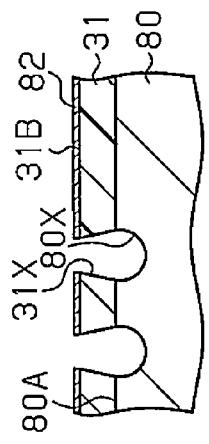

In the step illustrated in FIG. 7B, a seed layer 82 is formed to cover the entire surface of the mask 81 and the entire upper surface 31B of the insulation layer 31. The seed layer 82 may be formed by performing, for example, sputtering or vapor deposition. For example, when performing sputtering to form the seed layer 82, titanium (Ti) is first sputtered and deposited on the mask 81 and the insulation layer 31 to form a Ti layer that covers the entire surface of the mask 81 and the entire upper surface 31B of the insulation layer 31. Then, copper is sputtered and deposited on the Ti layer to form a Cu layer. This form the seed layer 82 with a double layer structure (Ti layer/Cu layer). As illustrated in FIG. 7C, each through hole 31X of the insulation layer 31 is inversely tapered so that the diameter decreases from the lower side, which faces the upper surface 80A of the support substrate 80, toward the upper side. Thus, although the seed layer 82 may be partially formed on the inner surface of the through hole 31X, the seed layer 82 would not entirely cover the inner surface of the through hole 31X. That is, the seed layer 82 continuously covers the upper and side surfaces of the mask 81 and the upper surface 31B of the insulation layer 31. However, the seed layer 82 does not continuously cover the wall surfaces of the through holes 31X and the wall surfaces of the recesses 80X.

Figure 7D:
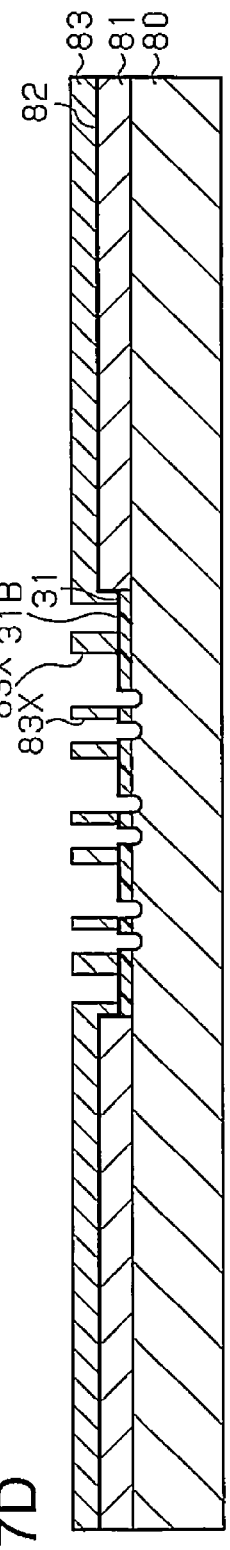

In the step illustrated in FIG. 7D, a resist layer 83, which includes opening patterns 83X at certain locations, is formed on the upper surface of the seed layer 82. The opening patterns 83X expose the upper surface of the seed layer 82 at locations corresponding to regions where the wiring patterns 32 (refer to FIGS. 1A and 1B) are formed. The material of the resist layer 83 is not particularly limited as long as the material is plating resistant and has the desired resolution properties. For example, the material of the resist layer 83 may be a photosensitive dry film resist or a liquid photoresist. The material of such a resist may be, for example, an epoxy resin, a novolac resin, an acrylic resin, or the like. The resist layer 83 may be formed in the same manner as the insulation layer 31.

In the step illustrated in FIG. 8A, electrolytic plating is performed on the upper surface 80A of the support substrate 80 using the insulation layer 31 and the resist layer 83 as plating masks and the support substrate 80 as a power supplying layer. More specifically, electrolytic plating is performed on the wall surfaces of recesses 80X exposed from the through holes 31X of the insulation layer 31 and the upper surface of the seed layer 82. This forms the contact terminals 33, in the through holes 31X and the recesses 80X, and the wiring patterns 32, on the contact terminals 33 and the seed layer 82.

As illustrated in FIG. 8B, in the electrolytic plating process, a plating film grows upward from the bottom of each recess 80X. This fills the recesses 80X and the through holes 31X with the contact terminals 33. When the electrolytic plating process is started, the plating film does not grow from the seed layer 82 formed on the upper surface 31B of the insulation layer 31. This is because the seed layer 82 is not continuously formed on the wall surfaces of the through holes 31X and the recesses 80X as described above, and the seed layer 82 on the upper surface 31B of the insulation layer 31 is not supplied with power through the support substrate 80. Thus, after the contact terminals 33 are formed and electrically connected to the seed layer 82, as illustrated in FIG. 8C, the plating film grows upward from the upper surfaces of the contact terminals 33 and the upper surface of the seed layer 82 to form a conductive layer 84 that covers the upper surfaces of the contact terminals 33 and the seed layer 82, which are exposed from the opening patterns 83X of the resist layer 83. In this manner, when the electrolytic plating process is started, a plating film does not grow from the upper surface of the seed layer 82. Thus, the conductive layer 84, which becomes the wiring patterns 32, may be formed after filling the recesses 80X and the through holes 31X with the plating film (contact terminals 33). This allows the conductive layer 84 (wiring patterns 32) to be easily adjusted to the desired thickness.

In the step illustrated in FIG. 8D, the resist layer 83 illustrated in FIG. 8A is removed with, for example, an alkali stripping solution.

In the step illustrated in FIG. 9A, the unnecessary seed layer 82 is etched and removed using the conductive layer 84 as an etching mask. The steps described above fill the recesses 80X and the through holes 31X with the contact terminals 33 as illustrated in FIGS. 9A and 9B, and lay out the wiring patterns 32, which include the seed layer 82 and the conductive layer 84, on the upper surfaces of the contact terminals 33 and the upper surface 31B of the insulation layer 31.

In the step illustrated in FIG. 9C, the mask 81 illustrated in FIG. 9A is removed. For example, when a masking tape is used as the mask 81, the mask 81 (masking tape) is mechanically stripped from the support substrate 80.

Figure 10A:
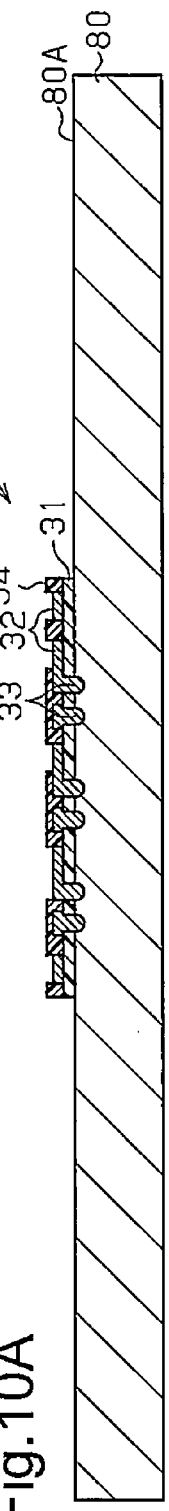
Figure 10B:
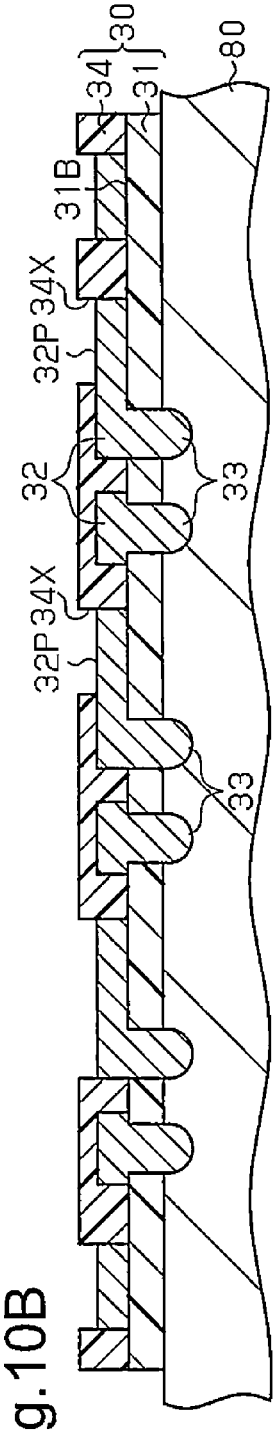

In the steps illustrated in FIGS. 10A and 10B, the insulation layer 34 is stacked on the upper surface 31B of the insulation layer 31. The insulation layer 34 includes openings 34X that expose the pads 32P, which are defined by the wiring patterns 32 at certain locations and used for wire bonding. The material of the insulation layer 34 may be, for example, a photosensitive dry film resist or a liquid photoresist. The material of such a resist may be, for example, an epoxy resin, a phenol resin, a polyimide resin, a novolac resin, or the like. The insulation layer 34 is formed in the same manner as the insulation layer 31.

The manufacturing steps described above forms the substrate 30 on the upper surface 80A of the support substrate 80.

Figure 10C:
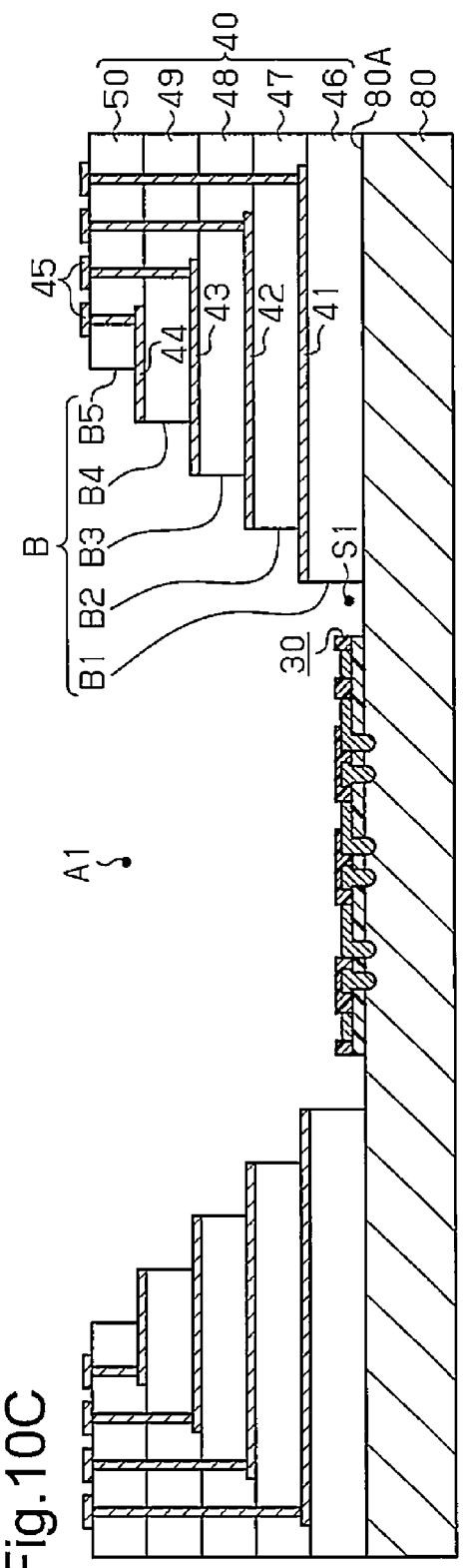

In the step illustrated in FIG. 10C, the frame-shaped wiring substrate 40, which includes the cavity B in the central portion, is formed on the upper surface 80A of the peripheral portion of the support substrate 80. For example, the wiring substrate 40 is prepared including the interlayer insulation layers 46, 47, 48, 49, and 50 and the wiring layers 41, 42, 43, 44, and 45 that are alternately stacked. The wiring substrate 40 is adhered to the upper surface 80A of the support substrate 80 with an adhesive agent (not illustrated). A buildup process may be performed to alternately stack the interlayer insulation layers 46, 47, 48, 49, and 50 and the wiring layers 41, 42, 43, 44, and 45 on the upper surface 80A of the support substrate 80. Here, the wiring substrate 40 is separated from the substrate 30 so as not to contact the substrate 30. That is, the clearance S1, which is frame-shaped as viewed from above, is formed between the wiring substrate 40 and the substrate 30. The inner side surfaces of the wiring substrate 40 and upper surface 80A of the support substrate 80 encompass an accommodation portion A1, which accommodates the substrate 30.

In the step illustrated in FIG. 11A, wire bonding is performed to electrically connect the wiring layers 41, 42, 43, and 44 to the pads 32P with the conductive wires W1 in the accommodation portion A1. In the present example, wire bonding is performed to electrically connect the connection pads 41P, 42P, 43P, and 44P of the wiring layers 41, 42, 43, and 44 to the pads 32P with the conductive wires W1.

In the step illustrated in FIG. 11B, the accommodation portion A1 is filled with the insulation layer 60. The insulation layer 60 completely seals the accommodation portion A1 (cavity B). The amount of the insulation layer 60 is sufficient for covering the upper surfaces and side surfaces of the wiring layers 41, 42, 43, 44, and 45, the side surfaces of the interlayer insulation layers 46, 47, 48, 49, and 50, the upper surface and side surfaces of the substrate 30, the upper surface 80A of the support substrate 80, and the conductive wires W1. The insulation layer 60 is formed so that the upper surface 60B of the interlayer insulation layer 60 is substantially flush with the upper surface 50B of the interlayer insulation layer 50. For example, the insulation layer 60 may be formed by performing a potting process to apply a liquid insulative resin to the accommodation portion A1 (cavity B), maintain the temperature at approximately 50° C. to 100° C., and harden the insulative resin. As a result, in the wiring substrate 40, the lower surface 46A of the interlayer insulation layer 46, the lower surface 31A of the insulation layer 31, and the lower surface 60A of the insulation layer 60 are shaped along and in conformance with the upper surface 80A (flat surface) of the support substrate 80. That is, the shape of the upper surface 80A of the support substrate 80 is transferred to the lower surface 46A of the interlayer insulation layer 46, the lower surface 31A of the insulation layer 31, and the lower surface 60A of the insulation layer 60. Thus, the lower surface 46A of the interlayer insulation layer 46, the lower surface 31A of the insulation layer 31, and the lower surface 60A of the insulation layer 60 are formed to be flat and flush with one another.

Figure 12:
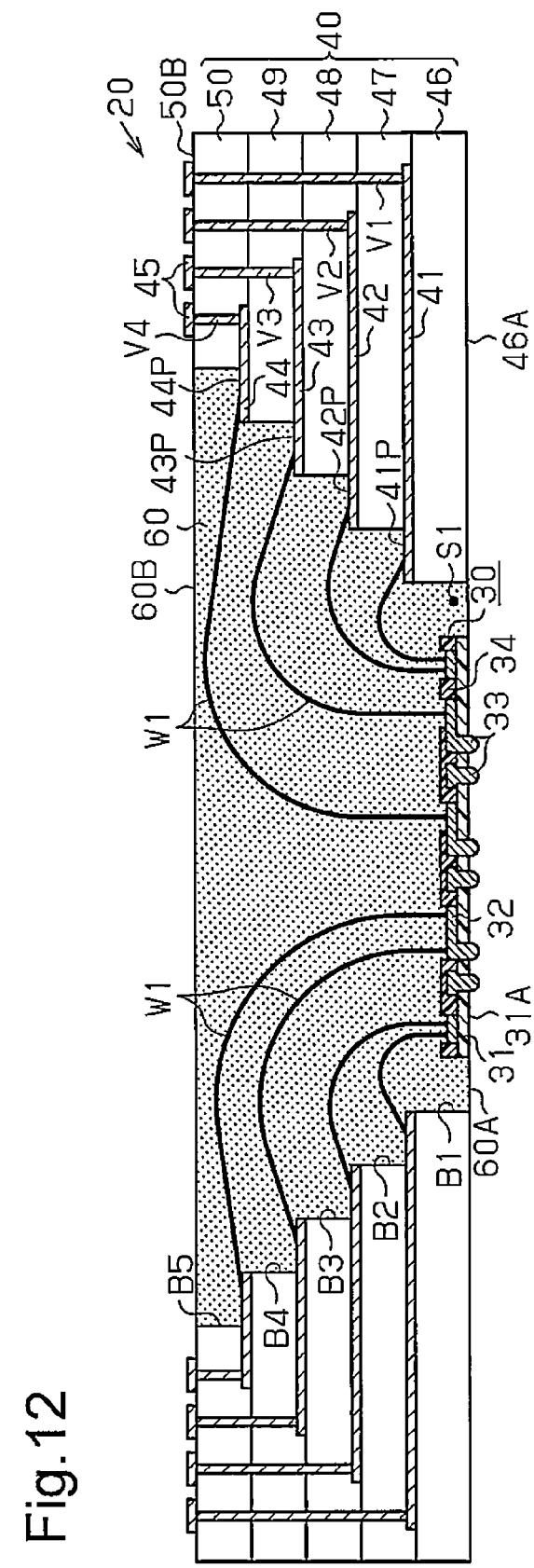

In the step illustrated in FIG. 12, the support substrate 80 illustrated in FIG. 11B is removed. For example, when using a copper plate as the support substrate 80, the support substrate 80 may be removed by performing wet etching using a ferric chloride solution, a copper chloride solution, an ammonium persulfate solution, or the like. In this case, the contact terminals 33 (e.g., Au layer), the insulation layers 31 and 60, and the interlayer insulation layer 46 that are in contact with the support substrate 80 illustrated in FIG. 11B function as etching stopper layers. This allows for only the support substrate 80, which is a copper plate, to be selectively etched.

The manufacturing steps described above manufactures the probe card 20 illustrated in FIG. 1A.

The present embodiment has the advantages described below.

(1) The insulation layer 31, which supports the contact terminals 33, is not directly joined with the wiring substrate 40. The insulation layer 60, which has elastomeric properties, bonds the insulation layer 31 to the wiring substrate 40. Thus, the wiring substrate 40 does not restrict deformation of the insulation layer 31 (substrate 30). Accordingly, when the test subject 70 warps or undulates, the insulation layer 31 deforms in conformance with the warping or undulation of the test subject 70. This allows the contact terminals 33 to accurately contact the electrode pads 70P of the test subject 70 even when the test subject 70 warps or undulates.

(2) As described above, in the conventional probe card, lead wires located in a resin layer are used to wire-bond and electrically connect the contact terminals laid out on a film-like insulation layer and wires formed on a substrate. Thus, the wire bonding pad pitch imposes limitations on the contact terminal pitch. This makes it difficult to narrow the electrode pad pitch of the test subject. For example, when the pitch of the electrode pads is narrow and less than 50 µm, it is difficult to produce contact terminals to conduct tests by performing four-terminal resistance measurement with the electrode pads. Although MicroElectroMechanical Systems (MEMS) technology may be used to produce the contact terminals (probe terminals) with a narrow pitch, the contact terminals would still not be able to conform to the warping or undulation of the test subject. Further, the use of MEMS technology would increase the manufacturing costs.

In contrast, the probe card 20 of the present example extends the wiring patterns 32 in the planar direction with the rewires 36 and forms the wire bonding pads 37 at locations separated from the contact terminals 33. Thus, even when the pitch of the electrode pads 70P of the test subject 70 is narrow and less than 50 µm and the pith of the contact terminal 33 is narrowed, the distance from the contact terminals 33 to the pads 37 may be increased in the planar direction by the rewires 36. This easily increases the pitch of the pads 32P to a distance that allows for wire bonding. As a result, the pitch of the contact terminals 33 may be easily narrowed in correspondence with the narrowed pitch of the electrode pads 70P. Accordingly, even when the pitch of the electrode pads 70P is narrowed, the probe card 20 may be manufactured including the contact terminals 33 to conduct tests by performing four-terminal resistance measurement with the electrode pads 70P. Further, the contact terminals 33 may be manufactured by performing electrolytic plating instead. Thus, MEMS technology is not used. This reduces the manufacturing costs of the probe card 20 as compared with when using MEMS technology.

(3) The seed layer 82 entirely covers the upper surface 31B of the insulation layer 31. Further, the seed layer 82 does not continuously cover the wall surfaces in the through holes 31X of the insulation layer 31 and the recesses 80X in the support substrate 80. Thus, when forming the contact terminals 33 and the wiring patterns 32 by performing electrolytic plating using the support substrate 80 as a power supplying layer, a plating film does not grow from the upper surface of the seed layer 82 when starting the plating process. Thus, after filling the recesses 80X and the through holes 31X with the plating film (contact terminals 33), the wiring patterns 32 may be formed on the contact terminals 33 and on the seed layer 82 exposed from the through holes 31X. This allows the wiring patterns 32 to be easily adjusted to the desired thickness.

It should be apparent to those skilled in the art that the present invention may be embodied in many other specific forms without departing from the spirit or scope of the invention. Particularly, it should be understood that the present invention may be embodied in the following forms.

In the above embodiment, the through holes 31X are inversely tapered. However, the shape of the through holes 31X is not limited.

Figure 13:
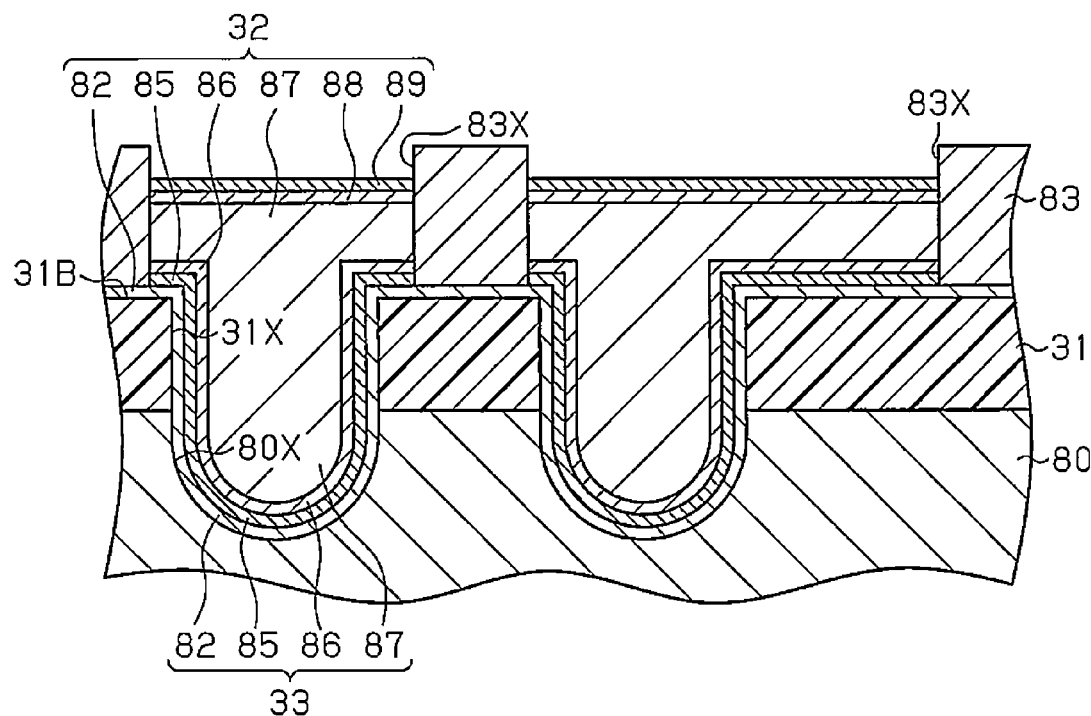
FIG. 13 is a schematic cross-sectional view illustrating contact terminals of a modification.

For example, as illustrated in FIG. 13, the through holes 31X may have a straight shape (tetragonal cross-section). In this case, the seed layer 82 may be formed to continuously cover the upper surface 31B of the insulation layer 31, the wall surfaces in the through holes 31X, and the wall surfaces in the recesses 80X. Alternatively, although not illustrated in the drawings, each through hole 31X may be tapered so that the diameter increases from the lower side, which faces the upper surface 80A of the support substrate 80, toward the upper side. In this case, the seed layer 82 may also be formed to continuously cover the upper surface 31B of the insulation layer 31, the wall surfaces in the through holes 31X, and the wall surfaces in the recesses 80X.

In the above embodiment, the wiring patterns 32 and the contact terminals 33 do not have to be formed by Au layers. For example, the wiring patterns 32 and the contact terminals 33 may each be a metal layer formed by sequentially stacking, from the lower side of the wiring pattern 32, an Au layer, a nickel (Ni) layer, a Cu layer, an Ni layer, and an Au layer. Alternatively, the wiring patterns 32 and the contact terminals 33 may each be a metal layer formed by sequentially stacking, from the lower side of the wiring pattern 32, a silver (Ag) layer, a palladium (Pd) layer, an Ni layer, a Cu layer, an Ni layer, a Pd layer, and an Ag layer. The Au layer is a metal layer formed from Au or an Au alloy. The Ag layer is a metal layer formed from Ag or an Ag alloy. The Ni layer is a metal layer formed from Ni or an Ni alloy. The Cu layer is a metal layer formed from Cu or a Cu alloy. The Pd layer is a metal layer formed from Pd or a Pd alloy. The Au layer, the Ag layer, the Ni layer, the Cu layer, and the Pd layer may be, for example, metal layers (electrolytic plating metal layer). In this manner, a metal layer formed by a metal or an alloy that functions as an etching stopper when etching and removing the support substrate 80 may be used as the material of the wiring patterns 32 and the contact terminals 33.

Referring to FIG. 13, a manufacturing method will now be described for a case in which the wiring patterns 32 and the contact terminals 33 are formed by sequentially stacking, from the lower surfaces of the wiring patterns 23, a seed layer 82, an Au layer 85, an Ni layer 86, a Cu layer 87, an Ni layer 88, and an Au layer 89. In this case, the seed layer 82 is formed to continuously cover the upper surface 31B of the insulation layer 31, the wall surfaces in the through holes 31X, and the wall surfaces in the recesses 80X.

The step illustrated in FIG. 13 is performed in lieu of the step illustrated in FIG. 8A. In the step illustrated in FIG. 13, electrolytic plating is performed on the upper surface of the seed layer 82 using the insulation layer 31 and the resist layer 83 as a plating mask and the support substrate 80 as a power supplying layer. More specifically, the support substrate 80 is first used as a plating power supplying layer to perform electrolytic Au plating and form the Au layer 85 on the upper surface of the seed layer 82, which is exposed from the opening patterns 83X of the resist layer 83. Then, the support substrate 80 is used as a plating power supplying layer to perform electrolytic Ni plating and form the Ni layer 86 on the upper surface of the Au layer 85. Then, the support substrate 80 is used as a plating power supplying layer to perform electrolytic Cu plating and form the Cu layer 87 on the upper surface of the Ni layer 86. Here, the recesses 80X and the through holes 31X at the inner side of the Ni layer 86 is filled with the Cu layer 87. This forms the contact terminals 33 with the seed layer 82, the Au layer 85, the Ni layer 86, and the Cu layer 87 in the recesses 80X and the through holes 31X.

Then, the support substrate 80 is used as a plating power supplying layer to perform electrolytic Ni plating and form the Ni layer 88 on the upper surface of the Cu layer 87. Then, the support substrate 80 is used as a plating power supplying layer to perform electrolytic Au plating and form the Au layer 89 on the upper surface of the Ni layer 88. This forms the wiring patterns 32 including the seed layer 82, the Au layer 85, the Ni layer 86, the Cu layer 87, the Ni layer 88, and the Au layer 89 on the upper surface 31B of the insulation layer 31 and the upper surfaces of the contact terminals 33 exposed from the opening patterns 83X.

In each of the above embodiments and modifications, the probe card 20 includes the contact terminals 33 that allow for four-terminal resistance measurement to be performed. However, the configuration of each of the above embodiments and modifications may be applied to a probe card including contact terminals that allow for two-terminal resistance measurement to be performed.

Figure 14:
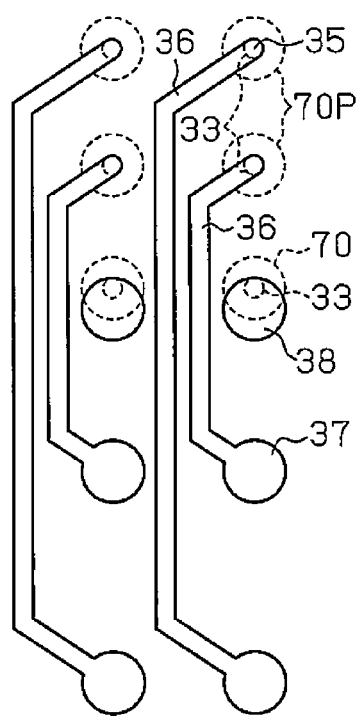
FIG. 14 is a schematic plan view illustrating wiring patterns and contact terminals of a modification.

In this case, as illustrated in FIG. 14, one contact terminal 33 contacts each electrode pad 70P. In this configuration, each wiring pattern 32, which serves as the first wiring pattern, includes the connection portion 35, which is connected to the corresponding contact terminal 33, the rewire 36, which is connected to the connection portion 35, and the pad 37, which is connected to the rewire 36 at the end opposite to the connection portion 35. The formation of the rewire 36 that includes the rewire 36 obtains advantages (1) to (3). In this case, the wiring patterns 32 (second wiring patterns) may also be formed including the pads 38 formed immediately above the connection portion 35.

In each of the above embodiments and modifications, the wiring patterns 32 includes the first wiring patterns, each including the rewire 36, and the second wiring patterns, each including only the pad 38 formed immediately above the connection portion 35. Instead, for example, every one of the wiring patterns 32 may be a first wiring pattern that includes the connection portion 35, the rewire 36, and the pad 37. In other words, in the examples illustrated in FIGS. 4 and 14, a configuration in which the pads 38 connected to the conductive wires W1 are formed immediately above the contact terminals is mixed with a configuration in which the pads 37 connected to the conductive wires W1 are separated from the contact terminals 33. However, pads connected to conductive wires W1 may all be formed at locations separated from the contact terminals 33.

In each of the above embodiments and modifications, the insulation layer 34 may be omitted.

In each of the above embodiments, the substrate 30 (insulation layer 31) is spaced apart from the wiring substrate 40 in the cavity B of the wiring substrate 40. However, there is no limit to such a configuration.

Figure 15:
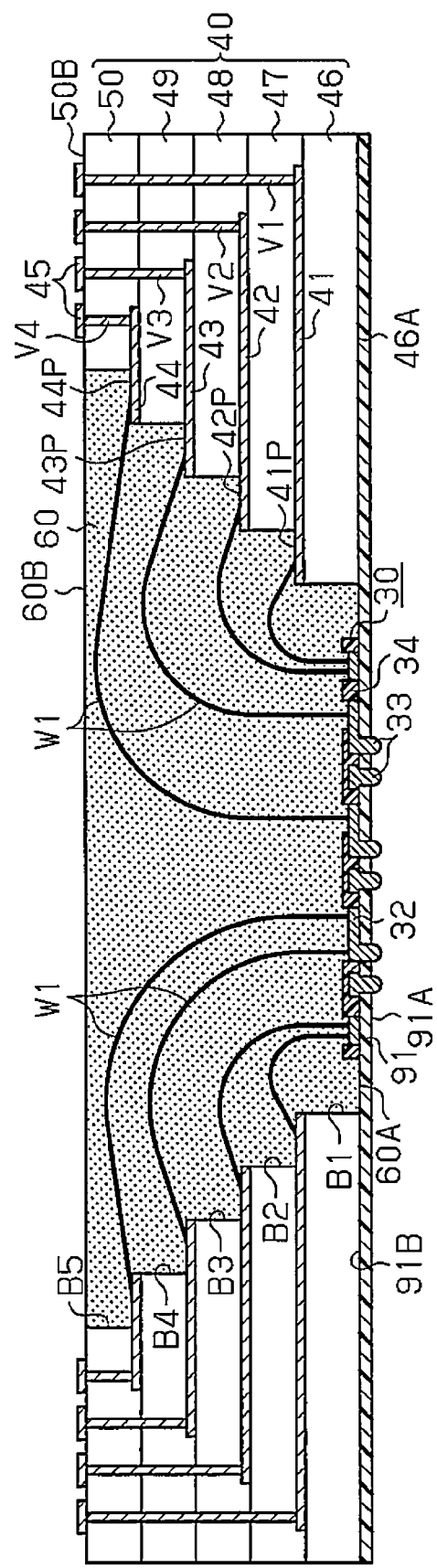
FIG. 15 is a schematic cross-sectional view illustrating a probe card of a modification.

For example, as illustrated in FIG. 15, an insulation layer 91 may be formed in lieu of the insulation layer 31. In addition to the entire lower surface of each wiring pattern 32 and the entire lower surface of the insulation layer 34, the insulation layer 91 entirely covers the lower surface 46A of the interlayer insulation layer 46 in the wiring substrate 40. Accordingly, the insulation layer 91, on which the contact terminals 33 are formed, is directly joined with the wiring substrate 40. The contact terminals 33 project downward from the lower surface 91A of the insulation layer 91. In such a configuration, the wiring patterns 32 of each of the above embodiments and modifications are formed on the upper surface 91B of the insulation layer 91. This obtains advantage (2) of the above embodiment.

In the above embodiment, the test subject 70 is a structure including the electrode pads 70P that are connected to circuit elements formed on a silicon substrate. Instead, for example, the test subject 70 may be a wiring substrate or the like in which electrodes that contact the contact terminals 33 are formed on a substrate formed from an organic resin.

The present examples and embodiments are to be considered as illustrative and not restrictive, and the invention is not to be limited to the details given herein, but may be modified within the scope and equivalence of the appended claims.

The invention claimed is:

1. A probe card comprising:
a first insulation layer;
a first contact terminal extending through the first insulation layer and projecting from a lower surface of the first insulation layer;
a wiring pattern arranged on an upper surface of the first insulation layer and including a rewire, which is connected to the first contact terminal, and a first pad, which is connected to the rewire;
a frame-shaped wiring substrate including an exposed upper surface and an exposed lower surface, wherein the frame-shaped wiring substrate includes
a plurality of interlayer insulation layers and a wiring layer that are alternately stacked, wherein the plurality of interlayer insulation layers are each frame-shaped and include a first interlayer insulation layer that serves as a lowermost layer of the frame-shaped wiring substrate, and the wiring layer is arranged on the first interlayer insulation layer, and
a cavity defined in a central portion of the frame-shaped wiring substrate, the cavity being surrounded by inner side surfaces of the plurality of interlayer insulation layers, wherein the first insulation layer is arranged in the cavity so that a frame-shaped clearance exists between an outer side surface of the first insulation layer and the inner side surfaces of the plurality of interlayer insulation layers as viewed from above;
a second insulation layer that supports the first insulation layer and the frame-shaped wiring substrate, wherein the cavity is filled with the second insulation layer; and
a conductive wire arranged in the second insulation layer to electrically connect the first contact terminal and the wiring layer, wherein
the first pad is bonded with the conductive wire, and
elasticity of the second insulation layer is smaller than elasticity of each of the plurality of interlayer insulation layers.

2. The probe card according to claim 1, further comprising:
a second contact terminal extending through the first insulation layer and projecting from the lower surface of the first insulation layer;
a second pad arranged on the upper surface of the first insulation layer and immediately above the second contact terminal; and
a further conductive wire arranged in the second insulation layer and bonded to the second pad.

3. The probe card according to claim 1, wherein
the first contact terminal is one of a plurality of contact terminals extending through the first insulation layer,
the plurality of contact terminals are arranged to form pairs of contact terminals so that the two contact terminals in each pair contact one of a plurality of electrodes of a test subject, and
one of the two contact terminals in each pair is the first contact terminal.

4. The probe card according to claim 2, wherein
the first contact terminal and the second contact terminal are each one of a plurality of contact terminals extending through the first insulation layer, the plurality of contact terminals are arranged to form pairs of contact terminals so that the two contact terminals in each pair contact one of a plurality of electrodes of a test subject, and the pairs of contact terminals include a pair of the first contact terminal and the second contact terminal.

5. The probe card according to claim 3, wherein the two contact terminals in each pair are separated from each other by an interval smaller than that between adjacent ones of the contact terminals in two different pairs.

6. The probe card according to claim 1, wherein elasticity of the first insulation layer is smaller than elasticity of each of the plurality of interlayer insulation layers.

7. The probe card according to claim 1, further comprising the insulation layer formed on the upper surface of the first insulation layer and including an opening that exposes the first pad of the wiring pattern.

8. The probe card according to claim 1, wherein the first contact terminal is formed integrally with the wiring pattern.

9. The probe card according to claim 1, wherein:
the plurality of interlayer insulation layers include
a second interlayer insulation layer stacked in a stepped-like manner on the first interlayer insulation layer to form a step and partially expose the wiring layer at the step; and
a portion of the first wiring layer exposed from the second interlayer insulation layer at the step serves as a connection pad bonded to the conductive wire.

10. The probe card according to claim 1, wherein a lower surface of the first interlayer insulation layer is flush with the lower surface of the first insulation layer and a lower surface of the second insulation layer.

* * * * *